US012777754B2

(12) United States Patent
Lin et al.

(10) Patent No.: US 12,777,754 B2
(45) Date of Patent: Oct. 27, 2026

(54) DISPLAY APPARATUS AND MANUFACTURING METHOD THEREOF

(71) Applicant: AUO Corporation, Hsin-Chu (TW)

(72) Inventors: Yu-Syuan Lin, Hsin-Chu (TW); Chun-Liang Lin, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 361 days.

(21) Appl. No.: 18/541,894

(22) Filed: Dec. 15, 2023

(65) Prior Publication Data

US 2024/0413275 A1 Dec. 12, 2024

(30) Foreign Application Priority Data

Jun. 9, 2023 (TW) ................................ 112121740

(51) Int. Cl.

| | |
|---|---|
| ***H10H 20/851*** | (2025.01) |
| ***H10H 20/01*** | (2025.01) |
| ***H10W 90/00*** | (2026.01) |

(52) U.S. Cl.

CPC .... *H10H 20/8516* (2025.01); *H10H 20/8514* (2025.01); *H10W 90/00* (2026.01); *H10H 20/0361* (2025.01)

(58) Field of Classification Search

None

See application file for complete search history.

(56) References Cited

U.S. PATENT DOCUMENTS

2021/0074770 A1* 3/2021 Choe .................... G02B 5/0278
2022/0352437 A1* 11/2022 Song .................. H10H 20/8515

FOREIGN PATENT DOCUMENTS

CN 114153091 A 3/2022

* cited by examiner

*Primary Examiner* — Nishath Yasmeen

(74) *Attorney, Agent, or Firm* — Tim Tingkang Xia, Esq.; Troutman Pepper Locke LLP

(57) ABSTRACT

A display apparatus includes a color filter substrate, a first encapsulation layer, a first bank layer, wavelength selective dimming patterns, color conversion patterns, a second encapsulation layer, a driving circuit substrate, a second bank layer and light emitting components. The wavelength selective dimming patterns are disposed in at least a portion of first openings of the first bank layer. The color conversion patterns are disposed in the first openings and on the wavelength selective dimming patterns. One wavelength selective dimming pattern includes a base material and scattering particles. The wavelength selective dimming pattern has a thickness within a range of 2 μm to 10 μm in a direction perpendicular to the color filter substrate. A volume ratio of the scattering particles to the wavelength selective dimming pattern falls within a range of 0.5% to 4.5%. Diameters of the scattering particles fall within a range of 80 nm to 200 nm.

6 Claims, 12 Drawing Sheets

CF { 110, 120, 130R, 130G, 130B }

CF {110, 120, 130R, 130G, 130B}

DISPLAY APPARATUS AND MANUFACTURING METHOD THEREOF

CROSS-REFERENCE TO RELATED PATENT APPLICATION

This non-provisional application claims priority to and the benefit of, pursuant to 35 U.S.C. § 119(a), patent application No. 112121740 filed in Taiwan on Jun. 9, 2023. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to an optoelectronic apparatus and a manufacturing method thereof, and particularly to a display apparatus and a manufacturing method thereof.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The flat display apparatus has the advantages of being lightweight, compact, and small in size, and has thus been widely applied in daily life. The flat display apparatus includes a driving circuit substrate, a plurality of light emitting components electrically connected to the driving circuit substrate and a color filter substrate disposed opposite to the driving circuit substrate. The color filter substrate includes a light shielding pattern layer and a plurality of color filter patterns. The light shielding pattern layer has a plurality of pixel openings overlapping with the light emitting components, and the color filter patterns are disposed in the pixel openings. The flat display apparatus may further include a plurality of color conversion patterns overlapping with the light emitting components to enhance color saturation. However, not all of the light beams emitted by the light emitting components are completely converted to light of the desired colors after passing through the color conversion patterns, resulting in the inability to further enhance the color saturation.

SUMMARY

The present disclosure provides a display apparatus with high optical efficiency.

The manufacturing method of the display apparatus according to one embodiment of the present disclosure includes the following steps: providing a color filter substrate; forming a first encapsulation layer on the color filter substrate; forming a first bank layer on the first encapsulation layer, wherein the first bank layer has a plurality of first openings; forming a plurality of wavelength selective dimming patterns in at least a portion of the first openings of the first bank layer; forming a plurality of color conversion patterns in the at least a portion of the first openings of the first bank layer and on the wavelength selective dimming patterns; forming a second encapsulation layer on the first bank layer and the color conversion patterns, wherein the color filter substrate, the first encapsulation layer, the first bank layer, the wavelength selective dimming patterns, the color conversion patterns and the second encapsulation layer form a color conversion substrate; forming a plurality of light emitting components and a second bank layer on a driving circuit substrate, and electrically connecting the light emitting components to the driving circuit substrate, wherein the second bank layer has a plurality of second openings, the light emitting components are disposed in the second openings, and the driving circuit substrate, the light emitting components and the second bank layer form a light emitting component array substrate; and assembling the color conversion substrate and the light emitting component array substrate, such that the color conversion substrate and the light emitting component array substrate are fixedly connected, wherein the first openings of the first bank layer respectively overlap with the second openings of the second bank layer. One of the wavelength selective dimming patterns comprises a base material and a plurality of scattering particles, the one of the wavelength selective dimming patterns has a thickness in a direction perpendicular to the color filter substrate, the thickness falls within a range of 2 μm to 10 μm, a volume ratio of the scattering particles to the one of the wavelength selective dimming patterns falls within a range of 0.5% to 4.5%, and diameters of the scattering particles fall within a range of 80 nm to 200 nm.

The display apparatus according to one embodiment of the present disclosure includes a color filter substrate, a first encapsulation layer, a first bank layer, a plurality of wavelength selective dimming patterns, a plurality of color conversion patterns, a second encapsulation layer, a driving circuit substrate, a second bank layer and a plurality of light emitting components. The first encapsulation layer is disposed on the color filter substrate. The first bank layer is disposed on the first encapsulation layer and has a plurality of first openings. The wavelength selective dimming patterns are disposed in at least a portion of the first openings of the first bank layer. The color conversion patterns are disposed in the at least a portion of the first openings of the first bank layer and on the wavelength selective dimming patterns. The second encapsulation layer is disposed on the first bank layer and the color conversion patterns. The driving circuit substrate is disposed opposite to the color filter substrate. The second bank layer is disposed on the driving circuit substrate and has a plurality of second openings. The first openings of the first bank layer respectively overlap with the second openings of the second bank layer. The light emitting components are disposed on the driving circuit substrate and are respectively located in the second openings of the second bank layer, and are electrically connected to the driving circuit substrate. In particular, one of the wavelength selective dimming patterns comprises a base material and a plurality of scattering particles, the one of the wavelength selective dimming patterns has a thickness in a direction perpendicular to the color filter substrate, the thickness falls within a range of 2 μm to 10 μm, a volume ratio of the scattering particles to the one of the wavelength selective dimming patterns falls within a range of 0.5% to 4.5%, and diameters of the scattering particles fall within a range of 80 nm to 200 nm.

These and other aspects of the present disclosure will become apparent from the following description of the embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1A:
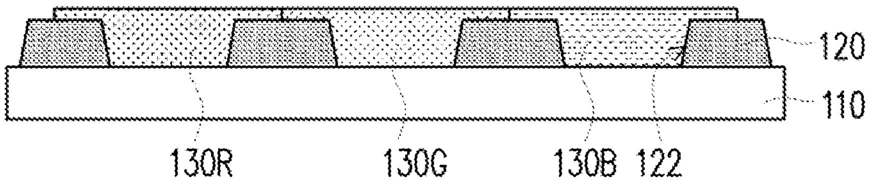
FIG. 1A to FIG. 1I are sectional schematic views of a manufacturing process of a display apparatus according to one embodiment of the present disclosure.

The present disclosure will now be described hereinafter in details with reference to the accompanying drawings, in which exemplary embodiments of the disclosure are shown. If possible, identical reference numerals refer to identical or like elements in the drawings and descriptions.

It should be understood that when one component such as a layer, a film, a region or a substrate is referred to as being disposed "on" the other component or "connected to" the other component, the component may be directly disposed on the other component or connected to the other component, or an intermediate component may also exist between the two components. In contrast, when one component is referred to as being "directly disposed on the other component" or "directly connected to" the other component, no intermediate component exists therebetween. As used herein, a "connection" may be a physical and/or electrical connection. In addition, when two components are "electrically connected" or "coupled", other components may exist between the two components.

The terms "about", "approximately" or "substantially" as used herein shall cover the values described, and cover an average value of an acceptable deviation range of the specific values ascertained by one of ordinary skill in the art, where the deviation range may be determined by the measurement described and specific quantities of errors related to the measurement (that is, the limitations of the measuring system). For example, the term "about" represents within one or more standard deviations of a given value of range, such as within +30 percent, within +20 percent, within +10 percent or within +5 percent. Moreover, the terms "about", "approximately" or "substantially" as used herein may selectively refer to a more acceptable deviation range or the standard deviation based on the optical characteristics, the etching characteristics or other characteristics, without applying one standard deviation to all characteristics.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1A to FIG. 1I are sectional schematic views of a manufacturing process of a display apparatus according to one embodiment of the present disclosure.

Referring to FIG. 1A, a color filter substrate CF is provided. In details, in one embodiment, a light shielding pattern layer 120 is firstly formed on a substrate 110, where the light shielding pattern layer 120 has a plurality of pixel openings 122. Then, a plurality of color filter patterns 130R, 130G, 130B are respectively formed in the pixel openings 122 of the light shielding pattern layer 120, thus forming the color filter substrate CF.

Referring to FIG. 1A, the color filter substrate CF includes the substrate 110, the light shielding pattern layer 120 disposed on the substrate 110 and the color filter patterns 130R, 130G, 130B disposed in the pixel openings 122 of the light shielding pattern layer 120. In one embodiment, the substrate 110 may be a transparent substrate, and the material of the transparent substrate is, for example, glass, quartz, an organic polymer or other suitable materials; the light shielding pattern layer 120 may be a black matrix, and the material of the black matrix is, for example, black resin or other suitable materials; the color filter patterns 130R, 130G, 130B have different colors, and the color filter patterns 130R, 130G, 130B include, for example, a red color filter pattern 130R, a green color filter pattern 130G and a blue color filter pattern 130B; but the present disclosure is not limited thereto.

Figure 1B:
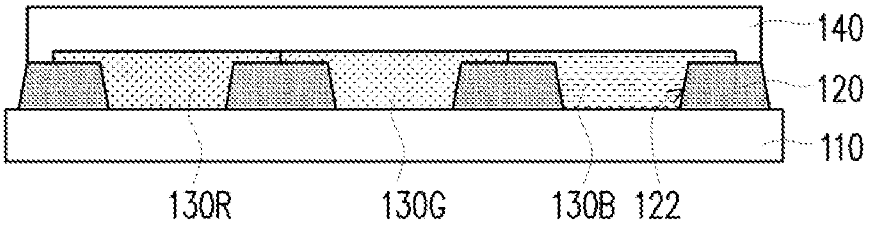

Referring to FIG. 1B, subsequently, a first encapsulation layer 140 is formed on the color filter substrate CF. In one embodiment, the first encapsulation layer 140 may completely cover the color filter substrate CF, but the present disclosure is not limited thereto. In one embodiment, the first encapsulation layer 140 may be a transparent inorganic material (such as silicon oxide, silicon nitride, silicon oxynitride, or a stacked layer of at least two of the materials), a transparent organic material or a combination thereof, but the present disclosure is not limited thereto.

Figure 1C:
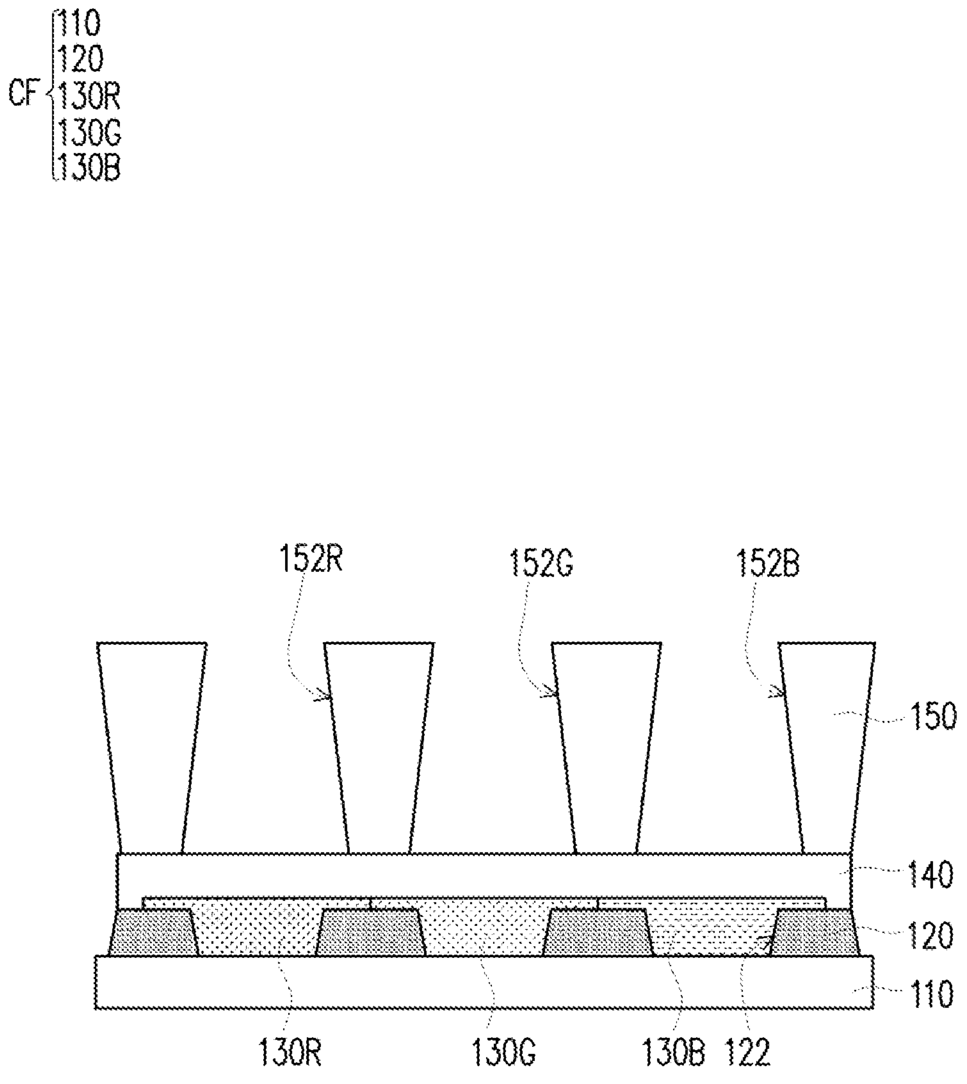

Referring to FIG. 1C, subsequently, a first bank layer 150 is formed on the first encapsulation layer 140. The first bank layer 150 has a plurality of first openings 152R, 152G, 152B. The first openings 152R, 152G, 152B of the first bank layer 150 respectively overlap with the color filter patterns 130R, 130G, 130B of the color filter substrate CF. In one embodiment, the material of the first bank layer 150 may absorb and/or reflect light, but the present disclosure is not limited thereto.

Figure 1D:
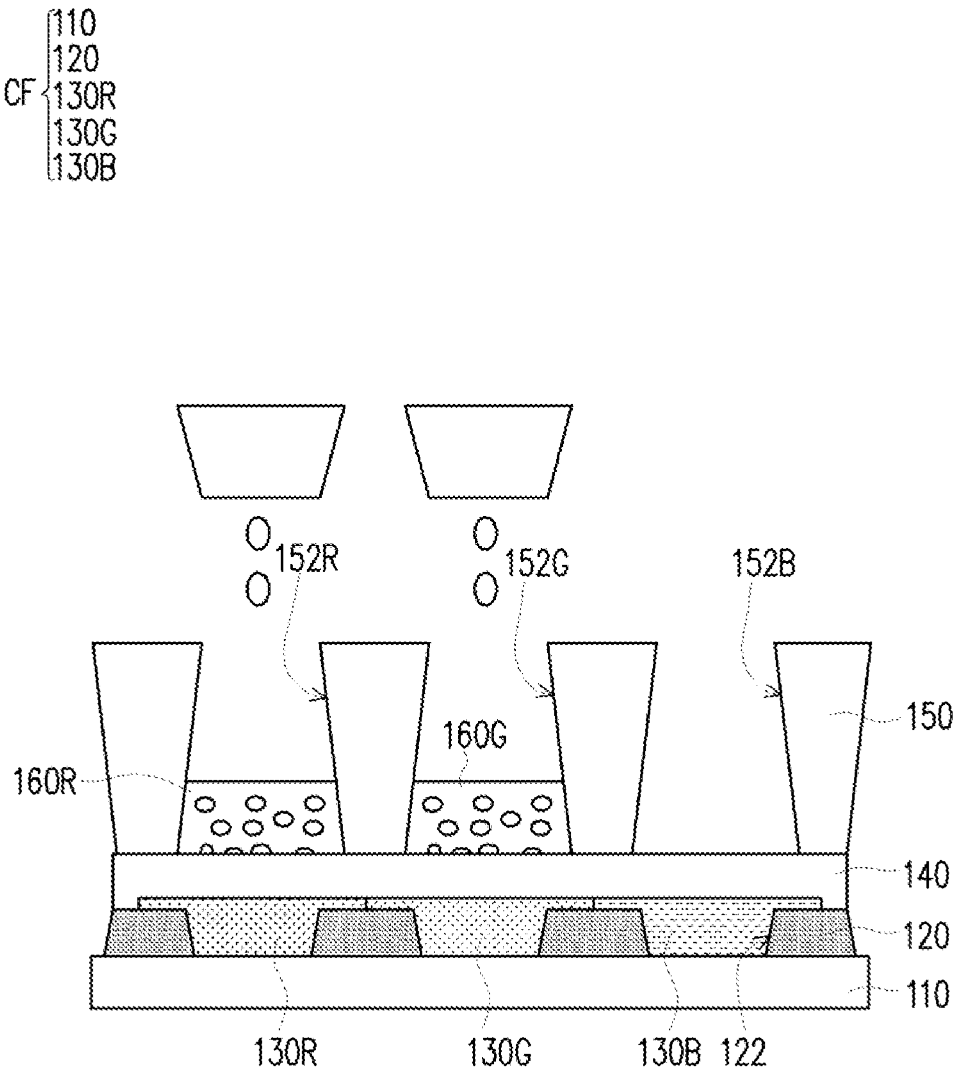

Referring to FIG. 1D, subsequently, a plurality of wavelength selective dimming patterns 160R, 160G are formed in at least a portion of the first openings 152R, 152G, 152B of the first bank layer 150. In one embodiment, the first openings 152R, 152G, 152B of the first bank layer 150 include the first opening 152R, the first opening 152G and the first opening 152B respectively overlapping with the red color filter pattern 130R, the green color filter pattern 130G and the blue color filter pattern 130B, and the wavelength selective dimming pattern 160R and the wavelength selective dimming pattern 160G are optionally formed in the first opening 152R and the first opening 152G respectively, but the present disclosure is not limited thereto. In one embodiment, the wavelength selective dimming patterns 160R, 160G are formed optionally by the ink-jet printing (IJP) method, but the present disclosure is not limited thereto. In other embodiments, it is possible to form the wavelength selective dimming patterns 160R, 160G by photolithography or other methods.

Figure 1E:
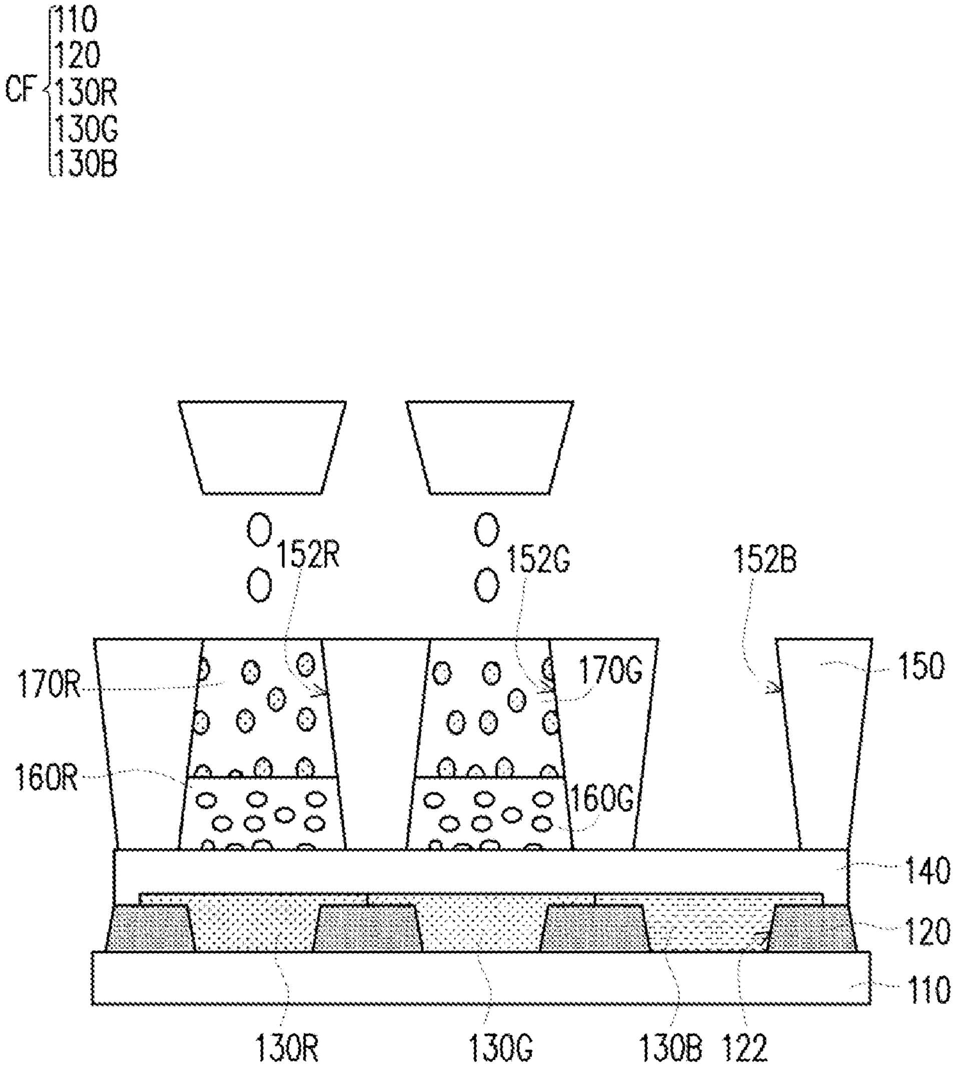

Referring to FIG. 1E, subsequently, a plurality of color conversion patterns 170R, 170G are formed in the at least a portion of the first openings 152R, 152G, 152B of the first bank layer 150 and on the wavelength selective dimming patterns 160R, 160G. In one embodiment, the color conversion patterns 170R, 170G are optionally formed in the first openings 152R, 152G overlapping with the red color filter pattern 130R and the green color filter pattern 130G and on the wavelength selective dimming patterns 160R, 160G, but the present disclosure is not limited thereto. In one embodiment, the color conversion patterns 170R, 170G are formed optionally by the ink-jet printing (IJP) method, but the present disclosure is not limited thereto. In other embodiments, it is possible to form the color conversion patterns 170R, 170G by other methods.

Figure 1F:
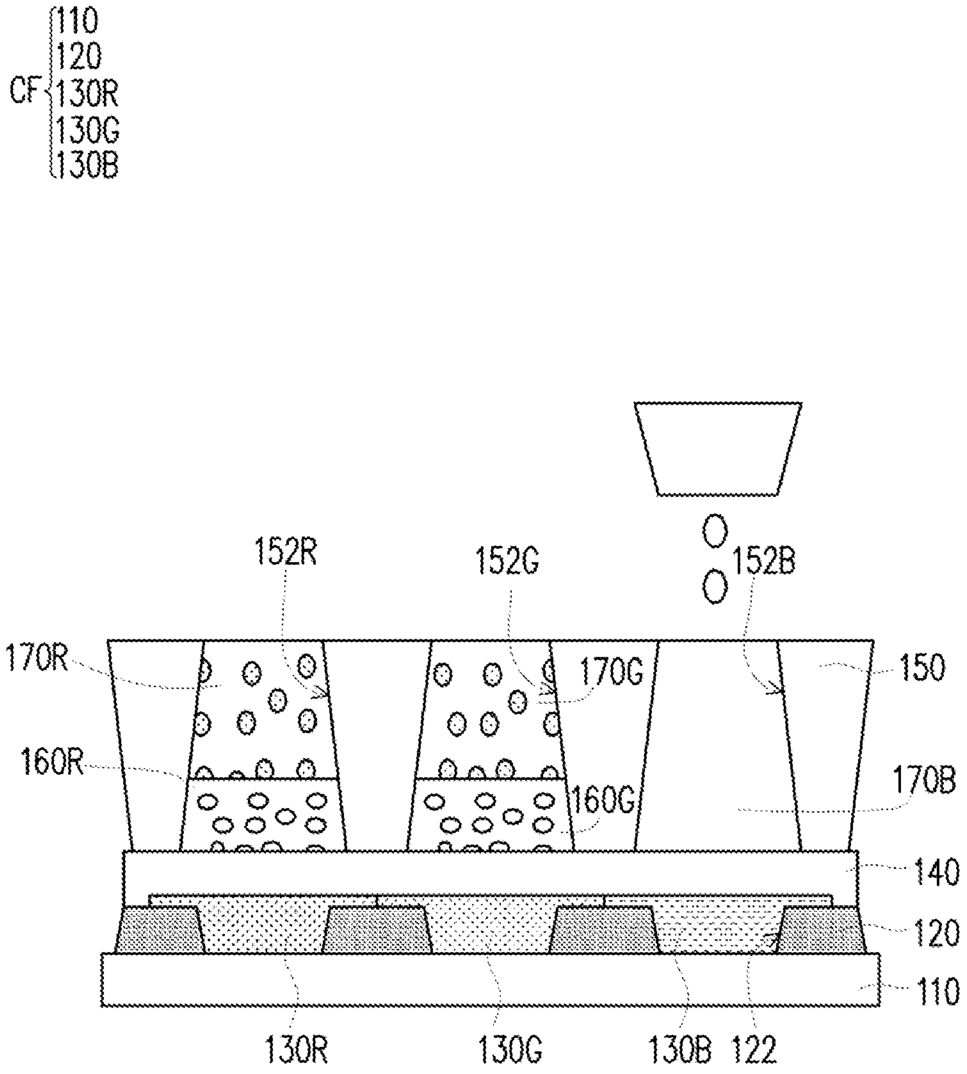

Referring to FIG. 1F, subsequently, a transparent pattern 170B is optionally formed in the first opening 152B of the first bank layer 150 overlapping with the blue color filter pattern 130B. In one embodiment, the transparent pattern 170B is formed optionally by the ink-jet printing (IJP) method, but the present disclosure is not limited thereto. In other embodiments, it is possible to form the transparent pattern 170B by photolithography or other methods.

The color conversion patterns 170R, 170G may have a photoluminescence (PL) material in a single-layered or multi-layered structure. The PL material may include a phosphor material, a quantum dot (QD) material, a perovskite material, or other suitable PL materials. For example, in one embodiment, the color conversion pattern 170R may include the quantum dot material used to generate the wavelength of the red light, the color conversion pattern 170G may include the quantum dot material used to generate the wavelength of the green light, and the transparent pattern 170B may include, for example, a transparent photoresist or a transparent flat layer, where the transparent pattern 170B is not doped with any quantum dot material, but the present disclosure is not limited thereto. In one embodiment, when the incident light (not illustrated) is the blue light, the color conversion pattern 170R may convert the wavelength of the blue light to the wavelength of the red light, the color conversion pattern 170G may convert the wavelength of the blue light to the wavelength of the green light, and the transparent pattern 170B may allow the incident light to pass therethrough. The emergent light passing through the color conversion pattern 170R, the color conversion pattern 170G and the transparent pattern 170B may respectively be the red light, the green light and the blue light.

Figure 1G:
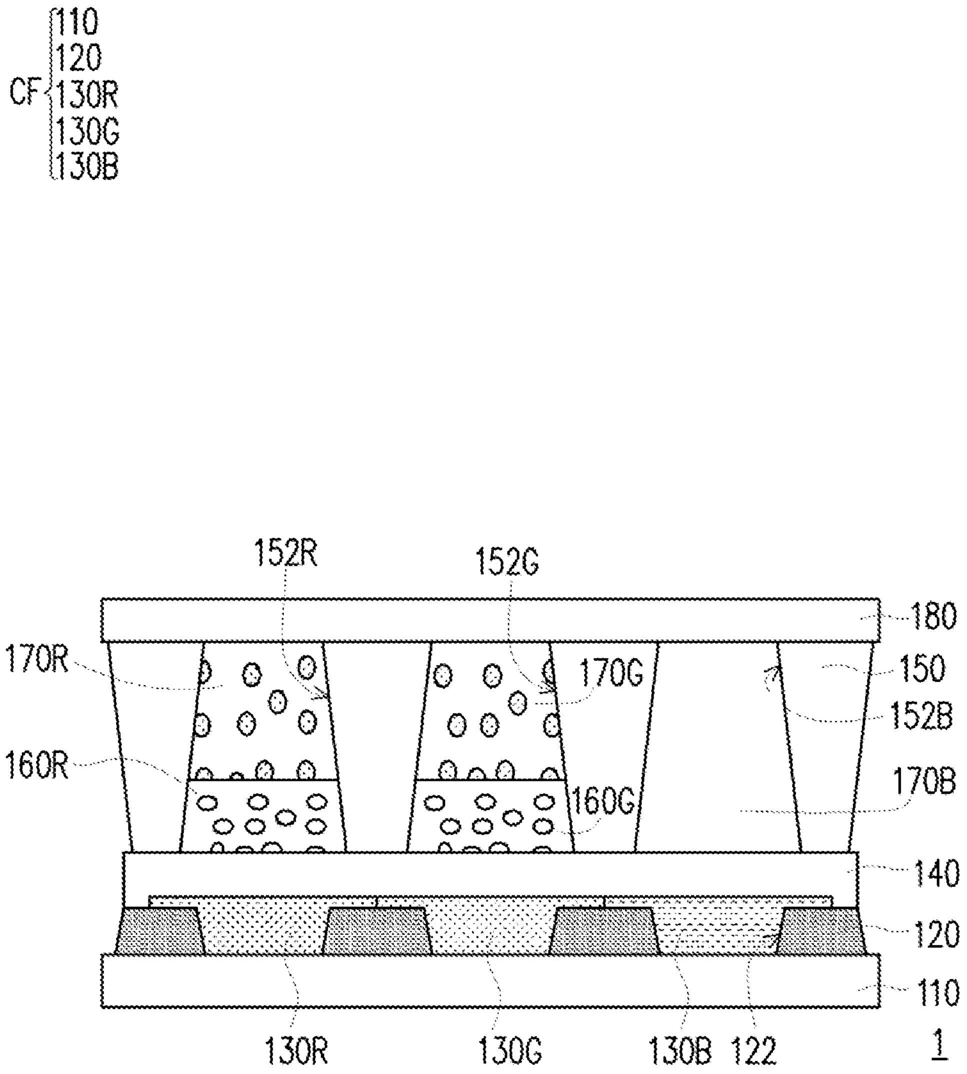

Referring to FIG. 1G, subsequently, a second encapsulation layer 180 is formed on the first bank layer 150 and the color conversion patterns 170R, 170G. In one embodiment, the second encapsulation layer 180 is formed on the first bank layer 150, the color conversion patterns 170R, 170G and the transparent pattern 170B, and the second encapsulation layer 180 completely covers the first bank layer 150, the color conversion patterns 170R, 170G and the transparent pattern 170B, but the present disclosure is not limited thereto. In one embodiment, the second encapsulation layer 180 may be a transparent inorganic material (such as silicon oxide, silicon nitride, silicon oxynitride, or a stacked layer of at least two of the materials), a transparent organic material or a combination thereof, but the present disclosure is not limited thereto.

Thus, a color conversion substrate 1 is completed. The color conversion substrate 1 includes the substrate 110, the light shielding pattern layer 120, the color filter patterns 130R, 130G, 130B, the first encapsulation layer 140, the first bank layer 150, the wavelength selective dimming patterns 160R, 160G, the color conversion patterns 170R, 170G and the second encapsulation layer 180. In one embodiment, the color conversion substrate 1 further includes the transparent pattern 170B.

Figure 1H:
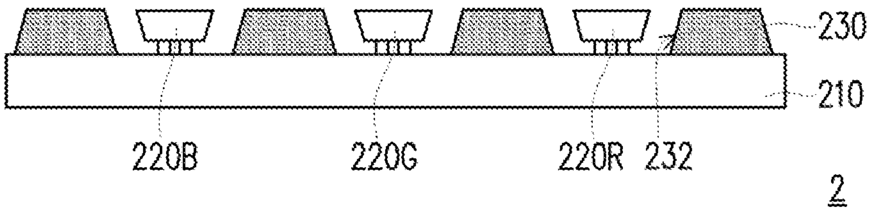

Referring to FIG. 1H, subsequently, a plurality of light emitting components 220R, 220G, 220B and a second bank layer 230 are formed on a driving circuit substrate 210, and the light emitting components 220R, 220G, 220B are electrically connected to the driving circuit substrate 210. The second bank layer 230 has a plurality of second openings 232, and the light emitting components 220R, 220G, 220B are disposed in the second openings 232. The driving circuit substrate 210, the light emitting components 220R, 220G, 220B and the second bank layer 230 form a light emitting component array substrate 2.

In one embodiment, the driving circuit substrate 210 may include a plurality of pixel driving structures (not illustrated), and each pixel driving structure may include a pixel driving circuit (not illustrated) and a pad set (not illustrated) electrically connected to the pixel driving circuit. In one embodiment, the pixel driving circuit may include a first transistor (not illustrated), a second transistor (not illustrated) and a capacitor (not illustrated). A first end of the first transistor is electrically connected to a corresponding data line (not illustrated). A control end of the first transistor is electrically connected to a corresponding scan line (not illustrated). A second end of the first transistor is electrically connected to a control end of the second transistor. A first end of the second transistor is electrically connected to a corresponding power line (not illustrated). The capacitor is electrically connected to the second end of the first transistor and the first end of the second transistor. A second end of the second transistor is electrically connected to a pad of the pad set, and another pad of the pad set is electrically connected to a corresponding common line (not illustrated). Each light emitting component 220R/220G/220B has a plurality of electrodes (not illustrated), and the electrodes of each light emitting component 220R/220G/220B are electrically connected to the pads of a corresponding pad set. In one embodiment, the light emitting component 220R, 220G, 220B are micro light emitting diodes (μLEDs) used to emit the blue light. However, the present disclosure is not limited thereto. In other embodiments, the pixel driving structures and/or the light emitting component 220R, 220G, 220B may be in other forms.

Figure 1I:
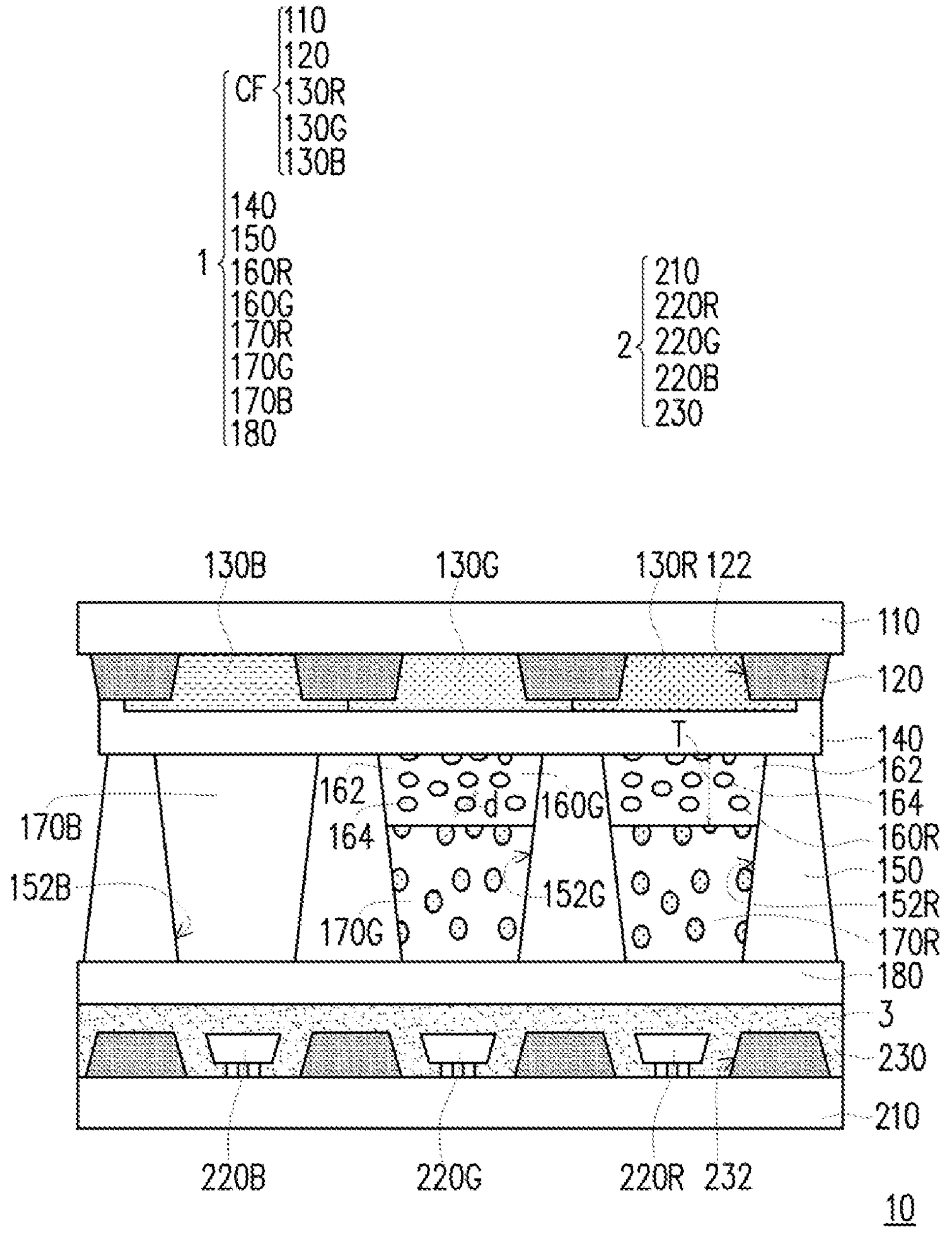

Referring to FIG. 1I, subsequently, the color conversion substrate 1 and the light emitting component array substrate 2 are assembled, such that the color conversion substrate 1 and the light emitting component array substrate 2 are fixedly connected, thus forming the display apparatus 10. The first openings 152R, 152G, 152B of the first bank layer 150 of the color conversion substrate 1 respectively overlap with the second openings 232 of the second bank layer 230. For example, in one embodiment, an adhering layer 3 is firstly formed on one of the color conversion substrate 1 and the light emitting component array substrate 2, and then the color conversion substrate 1 and the light emitting component array substrate 2 are assembled to each other, such that the color conversion substrate 1 and the light emitting component array substrate 2 are fixedly connected through the adhering layer 3.

Referring to FIG. 1I, the display apparatus 10 includes the color filter substrate CF, the first encapsulation layer 140, the first bank layer 150, the wavelength selective dimming patterns 160R, 160G, the color conversion patterns 170R, 170G, the second encapsulation layer 180, the driving circuit substrate 210, the second bank layer 230 and the light emitting components 220R, 220G, 220B. The first encapsulation layer 140 is disposed on the color filter substrate CF. The first bank layer 150 is disposed on the first encapsulation layer 140 and has a plurality of first openings 152R, 152G, 152B. The wavelength selective dimming patterns 160R, 160G are disposed in at least a portion of the first openings 152R, 152G, 152B of the first bank layer 150. The color conversion patterns 170R, 170G are disposed in the at least a portion of the first openings 152R, 152G, 152B of the first bank layer 150 and on the wavelength selective dimming patterns 160R, 160G. The color conversion pattern 170R and the wavelength selective dimming pattern 160R are arranged sequentially in a direction z away from the light emitting component 220R. The color conversion pattern 170G and the wavelength selective dimming pattern 160G are arranged sequentially in the direction z away from the light emitting component 220G. The second encapsulation layer 180 is disposed on the first bank layer 150 and the color conversion patterns 170R, 170G. The driving circuit substrate 210 is disposed opposite to the color filter substrate CF. The second bank layer 230 is disposed on the driving circuit substrate 210 and has a plurality of second openings 232. The first openings 152R, 152G, 152B of the first bank layer 150 respectively overlap with the second openings 232 of the second bank layer 230. The light emitting components 220R, 220G, 220B are disposed on the driving circuit substrate 210 and are respectively located in the second openings 232 of the second bank layer 230, and are electrically connected to the driving circuit substrate 210.

In particular, each of the wavelength selective dimming patterns 160R, 160G includes a base material 162 and a plurality of scattering particles 164. Each of the wavelength selective dimming patterns 160R, 160G has a thickness T in the direction z perpendicular to the color filter substrate CF, and the thickness T falls within a range of 2 μm to 10 μm. A volume ratio of the scattering particles 164 of each of the wavelength selective dimming patterns 160R, 160G to the wavelength selective dimming pattern 160R/160G falls within a range of 0.5% to 4.5%, and diameters d of the scattering particles 164 fall within a range of 80 nm to 200 nm. Thus, the reflectivity of each wavelength selective dimming pattern 160R/160G has wavelength selectivity.

The wavelength selective dimming patterns 160R/160G may allow the light beams emitted by the light emitting components 220R/220G and converted by the color conversion patterns 170R/170G to the desired colors, and reflect the light beams emitted by the light emitting components 220R/220G and passing through the color conversion patterns 170R/170G without being converted by the color conversion patterns 170R/170G back to the color conversion patterns 170R/170G. Thus, the light beams passing through the color conversion patterns 170R/170G without being converted by the color conversion patterns 170R/170G have another opportunity to be converted by the color conversion patterns 170R/170G to the light beams of the desired colors, thus enhancing the color conversion efficiency and the color saturation of the display apparatus 10.

For example, in one embodiment, the reflectivity of the wavelength selective dimming pattern 160R to the blue light is higher than the reflectivity thereof to the red light. The light emitting component 220R is used to emit the blue light (not illustrated). A part of the blue light is converted to the red light after passing through the color conversion pattern 170R, and most of the red light may pass through the wavelength selective dimming pattern 160R and then be emitted. The other part of the blue light emitted by the light emitting component 220R is not converted after passing through the color conversion pattern 170R, and is reflected by the wavelength selective dimming pattern 160R to the color conversion pattern 170R, such that the other part of the blue light not being converted may have another opportunity to be converted by the color conversion pattern 170R to the red light and then be emitted.

For example, in one embodiment, the reflectivity of the wavelength selective dimming pattern 160G to the blue light is higher than the reflectivity thereof to the green light. The light emitting component 220G is used to emit the blue light (not illustrated). A part of the blue light is converted to the green light after passing through the color conversion pattern 170G, and most of the green light may pass through the wavelength selective dimming pattern 160G and then be emitted. The other part of the blue light emitted by the light emitting component 220G is not converted after passing through the color conversion pattern 170G, and is reflected by the wavelength selective dimming pattern 160G to the color conversion pattern 170G, such that the other part of the blue light not being converted may have another opportunity to be converted by the color conversion pattern 170G to the green light and then be emitted.

In one embodiment, the thickness T of each wavelength selective dimming pattern 160R/160G falls preferably within a range of 2 μm to 6 μm, and the volume ratio of the scattering particles 164 of each wavelength selective dimming pattern 160R/160G to the wavelength selective dimming pattern 160R/160G falls within a range of 0.5% to 1.5%. The thinner the thickness T of the wavelength selective dimming pattern 160R/160G, the higher the volume ratio V % of the scattering particles 164 to the wavelength selective dimming pattern 160R/160G.

Table 1 lists the material of the transparent base material 162 of the wavelength selective dimming patterns 160R/160G, the refractive index of the transparent base material 162, the material of the scattering particles 164 of the wavelength selective dimming patterns 160R/160G, the refractive index of the scattering particles 164 of the wavelength selective dimming patterns 160R/160G, and a volume ratio V % of the scattering particles 164 of the wavelength selective dimming patterns 160R/160G to the wavelength selective dimming patterns 160R/160G in a plurality of embodiments of the present disclosure.

TABLE 1

| | | Embodiment 1 | Embodiment 2 | Embodiment 3 | Embodiment 4 | Embodiment 5 |
|---|---|---|---|---|---|---|
| Base material 162 of wavelength selective dimming patterns 160R/160G | Material | Photoresist | Photoresist | Photoresist | Acrylic | Acrylic |
| | Refractive index | 1.6 | 1.6 | 1.6 | 1.49 | 1.49 |
| Scattering particles 164 of wavelength selective dimming patterns 160R/160G | Material | $SiO_2$ | $TiO_2$ | $ZrO_2$ | $TiO_2$ | $AlO_2$ |
| | Refractive index | 1.45 | 2.3 | 2.3 | 2.3 | 1.7 |
| | Thickness T | 2 μm | 2 μm | 2 μm | 2 μm | 2 μm |
| | V % | 3% | 1.5% | 1.5% | 1.5% | 3% |

Figure 2:
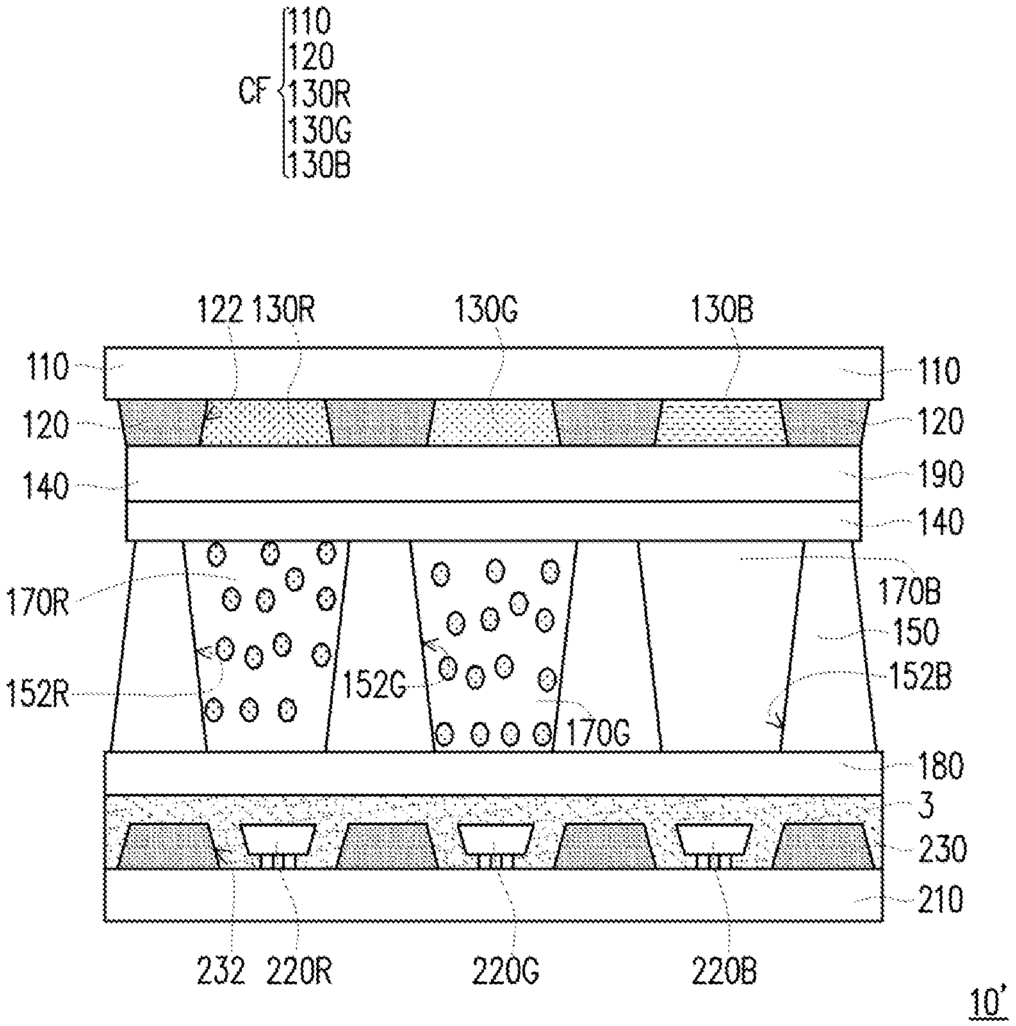
FIG. 2 is a sectional schematic view of a display apparatus according to a comparative embodiment.

FIG. 2 is a sectional schematic view of a display apparatus according to a comparative embodiment. The display apparatus 10' in the comparative embodiment of FIG. 2 is similar to the display apparatus 10 in the embodiment of the present disclosure of FIG. 1I, and the difference between the two exists in that: the display apparatus 10' in the comparative embodiment of FIG. 2 does not include the wavelength selective dimming patterns 160R, 160G in the embodiment of FIG. 1I, and compared to the display apparatus 10 in the embodiment of FIG. 1I, the display apparatus 10' in the comparative embodiment of FIG. 2 has a low refractive index layer 190 disposed between the color filter substrate CF and the first encapsulation layer 140. The refractive index of the low refractive index layer 190 is, for example, 1.2.

Figure 3:
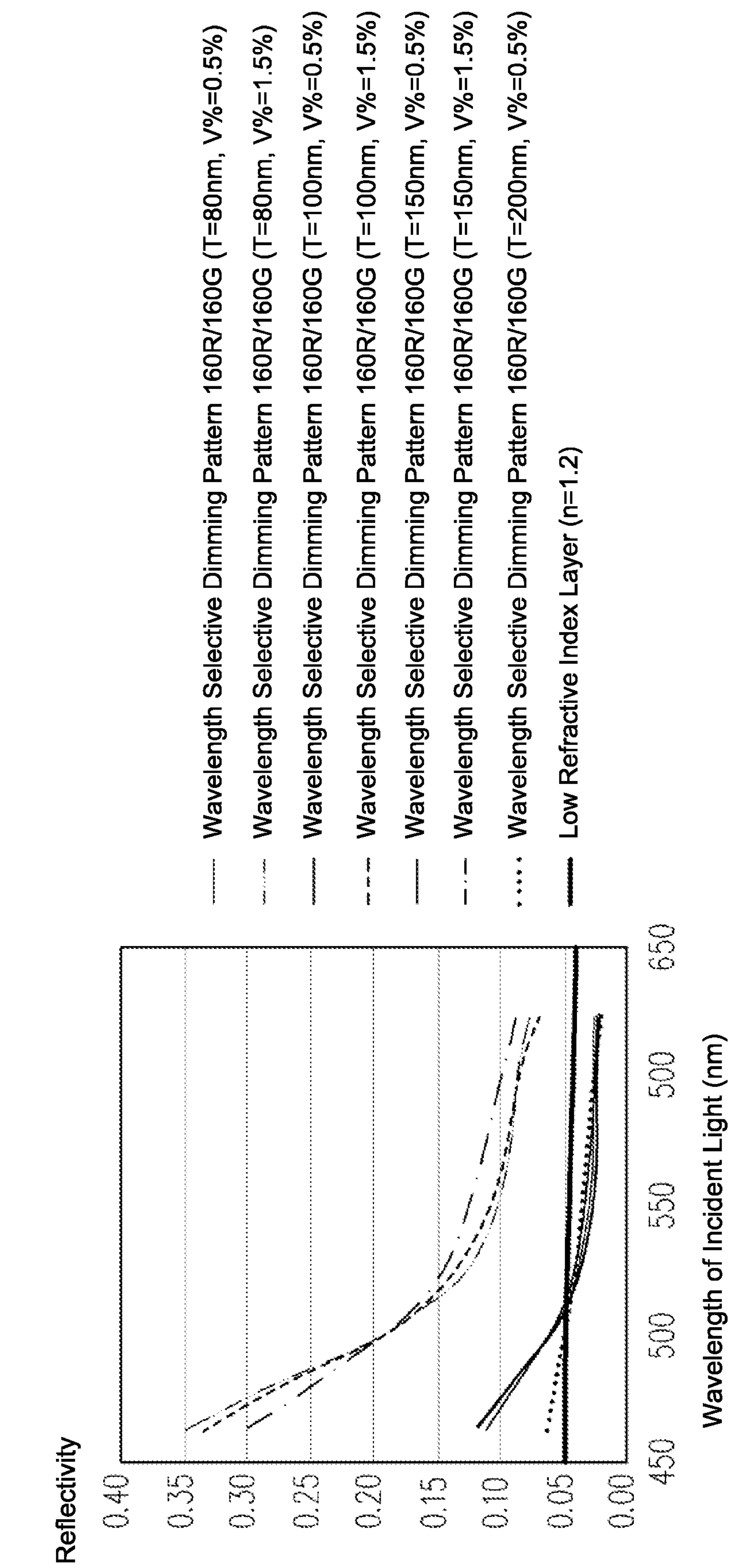
FIG. 3 illustrates simulations of the relationship between the wavelength of an incident light and the reflectivity of the wavelength selective dimming patterns of the display apparatus in one embodiment of the present disclosure and a low refractive index layer of the display apparatus in the comparative embodiment.

FIG. 3 illustrates simulations of the relationship between the wavelength of an incident light and the reflectivity of the wavelength selective dimming patterns 160R/160G of the display apparatus 10 in one embodiment of the present disclosure and a low refractive index layer 190 of the display apparatus 10' in the comparative embodiment. It is understood from FIG. 3 that, compared to the low refractive index layer 190 of the display apparatus 10' in the comparative embodiment, the reflectivity of the wavelength selective dimming patterns 160R/160G of the display apparatus 10 in the embodiment of the present disclosure has wavelength selectivity. In details, in one embodiment, the reflectivity of the wavelength selective dimming patterns 160R/160G of the display apparatus 10 in one embodiment of the present disclosure to the blue light with a central wavelength in the range of 450 nm~475 nm is significantly higher than the reflectivity thereof to the red light with a central wavelength in the range of 620 nm~650 nm and the reflectivity thereof to the green light with a central wavelength in the range of 495 nm~570 nm, and the reflectivity of the low refractive index layer 190 in the comparative embodiment to light beams with the wavelength of visible light is substantially identical (that is, without the wavelength selectivity).

Figure 4:
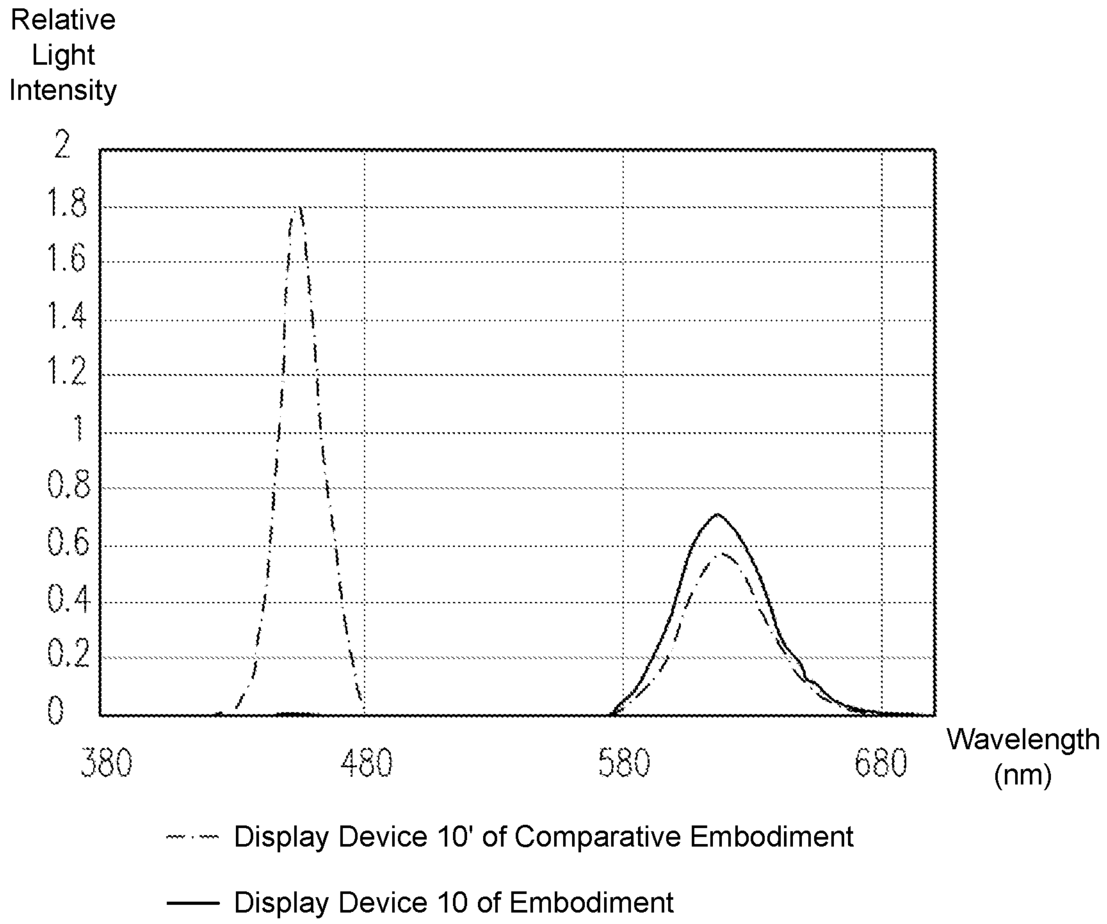
FIG. 4 illustrates simulations of the emission spectrum of the pixel area where a light emitting component of the display apparatus in one embodiment of the present disclosure are located and the emission spectrum of the pixel area where a light emitting component of the display apparatus in the comparative embodiment are located.

FIG. 4 illustrates simulations of the emission spectrum of the pixel area where a light emitting component 220R of the display apparatus 10 in one embodiment of the present disclosure are located and the emission spectrum of the pixel area where a light emitting component 220R of the display apparatus 10' in the comparative embodiment are located.

For the display apparatus 10 in the embodiment, the conversion factor R/B refers to a ratio R/B of the brightness R of the emergent red light after the blue light emitted by the light emitting component 220R passes through the color conversion pattern 170R and the wavelength selective dimming pattern 160R to the brightness B of the blue light emitted by the light emitting component 220R. For the display apparatus 10' in the comparative embodiment, the conversion factor R/B refers to a ratio R/B of the brightness R of the emergent red light after the blue light emitted by the light emitting component 220R passes through the color conversion pattern 170R and the low refractive index layer 190 to the brightness B of the blue light emitted by the light emitting component 220R. It is understood from FIG. 4 that, compared to the comparative embodiment, the conversion factor R/B of the display apparatus 10 in the embodiment is significantly higher. For example, in one embodiment, the conversion factor R/B of the display apparatus 10 in the embodiment is 1.6, and the conversion factor R/B in the comparative embodiment is 1.3.

Based on the simulated data in FIG. 3 and FIG. 4, it can be inferred that, compared to the display apparatus 10' in the comparative embodiment, the display apparatus 10 in the embodiment may enhance the color conversion efficiency and the color saturation through the wavelength-selective dimming patterns 160R and 160G.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A manufacturing method of a display apparatus, comprising:

providing a color filter substrate;

forming a first encapsulation layer on the color filter substrate;

forming a first bank layer on the first encapsulation layer, wherein the first bank layer has a plurality of first openings;

forming a plurality of wavelength selective dimming patterns in at least a portion of the first openings of the first bank layer;

forming a plurality of color conversion patterns in the at least a portion of the first openings of the first bank layer and on the wavelength selective dimming patterns;

forming a second encapsulation layer on the first bank layer and the color conversion patterns, wherein the color filter substrate, the first encapsulation layer, the first bank layer, the wavelength selective dimming patterns, the color conversion patterns and the second encapsulation layer form a color conversion substrate;

forming a plurality of light emitting components and a second bank layer on a driving circuit substrate, and electrically connecting the light emitting components to the driving circuit substrate, wherein the second bank layer has a plurality of second openings, the light emitting components are disposed in the second openings, and the driving circuit substrate, the light emitting components and the second bank layer form a light emitting component array substrate; and assembling the color conversion substrate and the light emitting component array substrate, such that the color conversion substrate and the light emitting component array substrate are fixedly connected, wherein the first openings of the first bank layer respectively overlap with the second openings of the second bank layer;

wherein each of the light emitting components is configured to emit a blue light;

wherein the color conversion patterns comprise a first color conversion pattern configured to convert a part of the blue light to a red light, and other part of the blue light is not converted by the first color conversion pattern;

wherein the wavelength selective dimming patterns comprise a first wavelength selective dimming pattern corresponding to the first color conversion pattern, and the first color conversion pattern is disposed between the first wavelength selective dimming pattern and the light emitting component array substrate; and wherein the first wavelength selective dimming pattern comprises a base material and a plurality of scattering particles, the first wavelength selective dimming pattern has a thickness in a direction perpendicular to the color filter substrate, the thickness falls within a range of 2 μm to 10 μm, a volume ratio of the scattering particles to the first wavelength selective dimming pattern falls within a range of 0.5% to 4.5%, and diameters of the scattering particles fall within a range of 80 nm to 200 nm so that a reflectivity of the first wavelength selective dimming pattern to the blue light is higher than a reflectivity of the first wavelength selective dimming pattern to the red light.

2. The manufacturing method of the display apparatus according to claim 1, wherein the thickness falls within a range of 2 μm to 6 μm, and the volume ratio of the scattering particles to the first wavelength selective dimming pattern falls within a range of 0.5% to 1.5%.

3. The manufacturing method of the display apparatus according to claim 1, wherein the color conversion patterns further comprise a second color conversion pattern configured to convert a part of the blue light to a green light, the wavelength selective dimming patterns further comprise a second wavelength selective dimming pattern corresponding to the second color conversion pattern, the second color conversion pattern is disposed between the second wavelength selective dimming pattern and the light emitting component array substrate, other part of the blue light is not converted by the second color conversion pattern, and a reflectivity of the second wavelength selective dimming pattern to the blue light is higher than a reflectivity of the second wavelength selective dimming pattern to the green light.

4. A display apparatus, comprising:

a color filter substrate;

a first encapsulation layer, disposed on the color filter substrate;

a first bank layer, disposed on the first encapsulation layer, and having a plurality of first openings;

a plurality of wavelength selective dimming patterns, disposed in at least a portion of the first openings of the first bank layer, wherein the wavelength selective dimming patterns comprise a first wavelength selective dimming pattern;

a plurality of color conversion patterns, disposed in the at least a portion of the first openings of the first bank layer and on the wavelength selective dimming patterns, wherein the color conversion patterns comprise a first color conversion pattern, and the first wavelength selective dimming pattern corresponds to the first color conversion pattern;

a second encapsulation layer, disposed on the first bank layer and the color conversion patterns;

a driving circuit substrate, disposed opposite to the color filter substrate;

a second bank layer, disposed on the driving circuit substrate, and having a plurality of second openings, wherein the first openings of the first bank layer respectively overlap with the second openings of the second bank layer; and a plurality of light emitting components, disposed on the driving circuit substrate, and respectively located in the second openings of the second bank layer, and electrically connected to the driving circuit substrate, wherein each of the light emitting components is configured to emit a blue light;

wherein the driving circuit substrate, the light emitting components and the second bank layer form a light emitting component array substrate, and the first color conversion pattern is disposed between the first wavelength selective dimming pattern and the light emitting component array substrate;

wherein the first color conversion pattern is configured to convert a part of the blue light to a red light, and other part of the blue light is not converted by the first color conversion pattern; and wherein the first wavelength selective dimming pattern comprises a base material and a plurality of scattering particles, the first wavelength selective dimming pattern has a thickness in a direction perpendicular to the color filter substrate, the thickness falls within a range of 2 μm to 10 μm, a volume ratio of the scattering particles to the first wavelength selective dimming pattern falls within a range of 0.5% to 4.5%, and diameters of the scattering particles fall within a range of 80 nm to 200 nm so that a reflectivity of the first wavelength selective dimming pattern to the blue light is higher than a reflectivity of the first wavelength selective dimming pattern to the red light.

5. The display apparatus according to claim 4, wherein the thickness falls within a range of 2 μm to 6 μm, and the volume ratio of the scattering particles to the first wavelength selective dimming pattern falls within a range of 0.5% to 1.5%.

6. The display apparatus according to claim 4, wherein the color conversion patterns further comprise a second color conversion pattern configured to convert a part of the blue light to a green light, the wavelength selective dimming patterns further comprise a second wavelength selective dimming pattern corresponding to the second color conversion pattern, the second color conversion pattern is disposed between the second wavelength selective dimming pattern and the light emitting component array substrate, other part of the blue light is not converted by the second color conversion pattern, and a reflectivity of the second wavelength selective dimming pattern to the blue light is higher than a reflectivity of the second wavelength selective dimming pattern to the green light.

* * * * *